(12) United States Patent
Cram

(10) Patent No.: US 6,727,715 B2
(45) Date of Patent: Apr. 27, 2004

(54) TEST SYSTEM AND TEST CONTACTOR FOR ELECTRONIC MODULES HAVING BEAM SPRING CONTACTS

(75) Inventor: Daniel P. Cram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/236,276

(22) Filed: Sep. 6, 2002

(65) Prior Publication Data

US 2003/0006789 A1 Jan. 9, 2003

Related U.S. Application Data

(62) Division of application No. 09/650,161, filed on Aug. 28, 2000, now Pat. No. 6,483,329.

(51) Int. Cl.[7] .......................... G01R 1/073; G01R 31/02
(52) U.S. Cl. ........................ 324/754; 324/755; 324/765
(58) Field of Search .................................. 324/755, 754, 324/757, 762, 765, 158.1; 439/259, 260, 263, 264, 266, 267

(56) References Cited

U.S. PATENT DOCUMENTS

| | | |
|---|---|---|
| 434,151 A | 8/1890 | Shailenberger |
| 500,918 A | 7/1893 | Linton |
| 3,274,534 A | 9/1966 | Shortridge |
| 4,068,170 A | 1/1978 | Chayka et al. |
| 4,355,856 A * | 10/1982 | Porter .......................... 439/437 |
| 4,574,235 A | 3/1986 | Kelly et al. |
| 4,591,219 A * | 5/1986 | Reimer .......................... 439/81 |
| 5,208,529 A | 5/1993 | Tsurishima et al. |
| 5,227,717 A | 7/1993 | Tsurishima et al. |
| 5,360,348 A | 11/1994 | Johnson |
| 5,415,560 A | 5/1995 | Balyasny |
| 5,625,297 A | 4/1997 | Arnaudov et al. |
| 5,667,077 A | 9/1997 | Goins, III |
| 5,754,057 A | 5/1998 | Hama et al. |
| 5,818,219 A | 10/1998 | Hama et al. |
| 5,823,823 A * | 10/1998 | Longueville et al. ........ 439/571 |
| 5,865,319 A | 2/1999 | Okuda et al. |
| 5,954,205 A | 9/1999 | Smith |
| 5,973,394 A | 10/1999 | Slocum et al. |
| 5,990,693 A | 11/1999 | Hayes et al. |
| 6,045,370 A | 4/2000 | Treibergs et al. |
| 6,060,893 A | 5/2000 | Farnworth et al. |
| 6,064,218 A | 5/2000 | Godfrey et al. |
| 6,091,062 A | 7/2000 | Pfahnl et al. |
| 6,097,201 A | 8/2000 | Slocum |
| 6,133,745 A * | 10/2000 | Yoon et al. .................. 324/755 |
| 6,447,317 B1 * | 9/2002 | Billman ...................... 439/260 |
| 6,462,568 B1 | 10/2002 | Cram |
| 6,483,329 B1 | 11/2002 | Cram |

* cited by examiner

*Primary Examiner*—Ernest Karlsen
(74) *Attorney, Agent, or Firm*—Stephen A. Gratton

(57) ABSTRACT

A pass through test system for testing an electronic module includes an interface board, and test contactors movably mounted to the interface board for electrically engaging terminal contacts on the module with a zero insertion force on the modules. The interface board is configured for mounting to an automated or manual pass through test handler in electrical communication with test circuitry. In a first embodiment the interface board includes test pads in electrical communication with the test circuitry, and rotatable test contactors having spring contacts configured to simultaneously engage the test pads and the terminal contacts on the module. In a second embodiment the interface board includes test pads in electrical communication with the test circuitry, and slidable test contactors having beam leads configured to simultaneously engage the test pads and the terminal contacts on the module. In a third embodiment the test contactors are slidably mounted to the interface board, and include coiled spring contacts in electrical communication with a flex circuit. A test method includes the steps of: providing the test contactors, electrically engaging the terminal contacts on the module with a zero insertion force using the test contactors, and then applying test signals through the test contactors and the terminal contacts to the module.

11 Claims, 8 Drawing Sheets

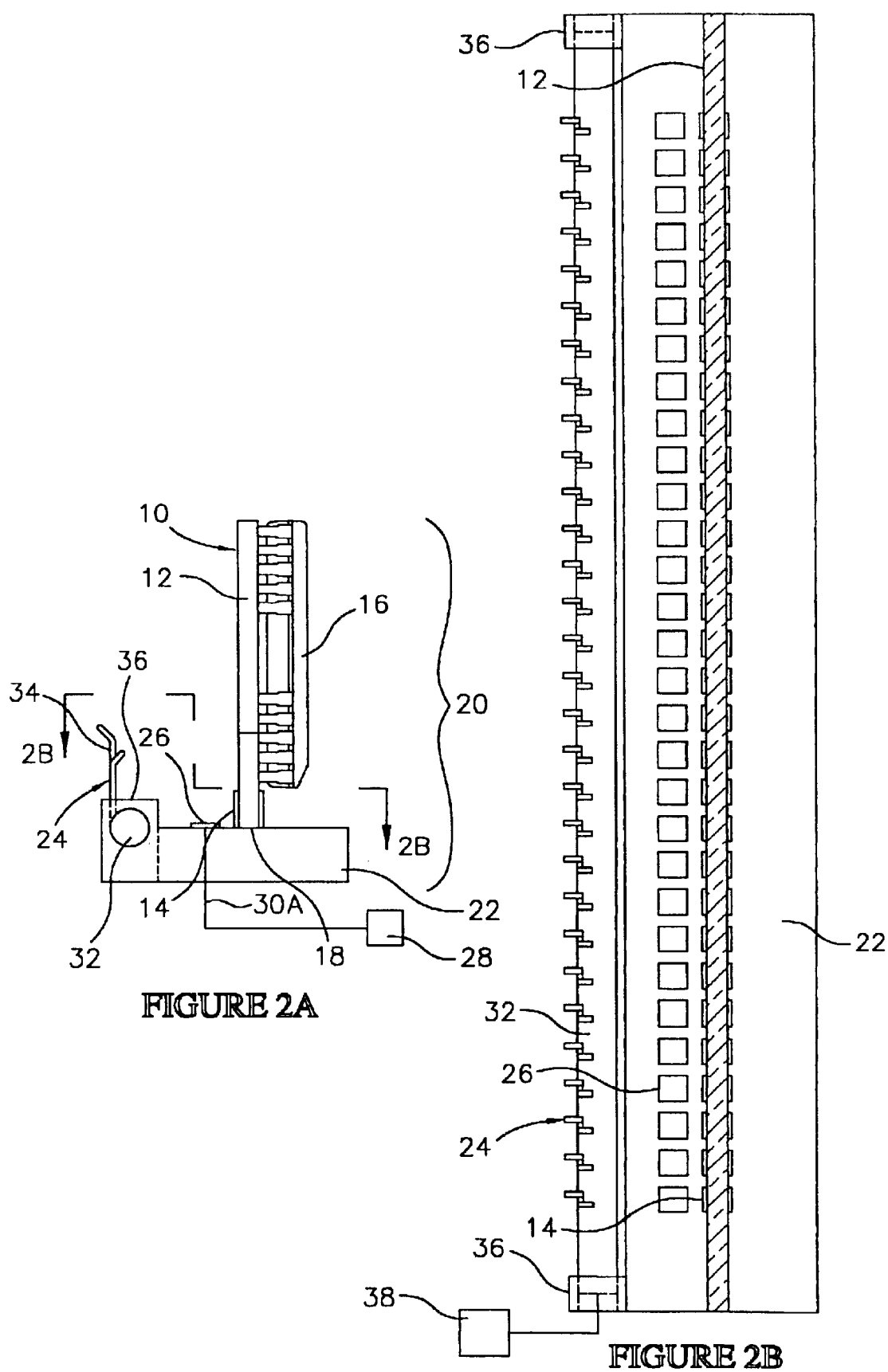

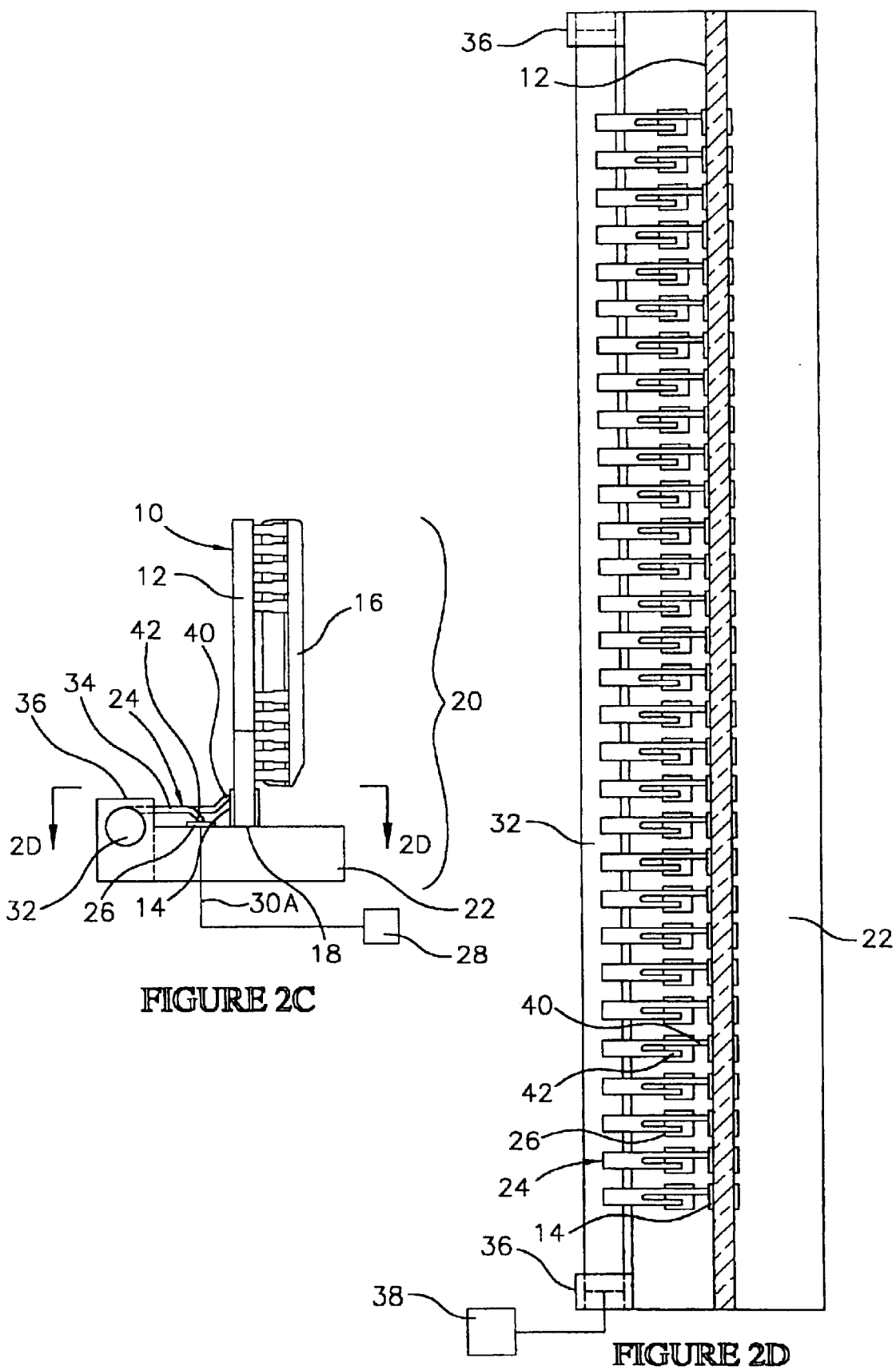

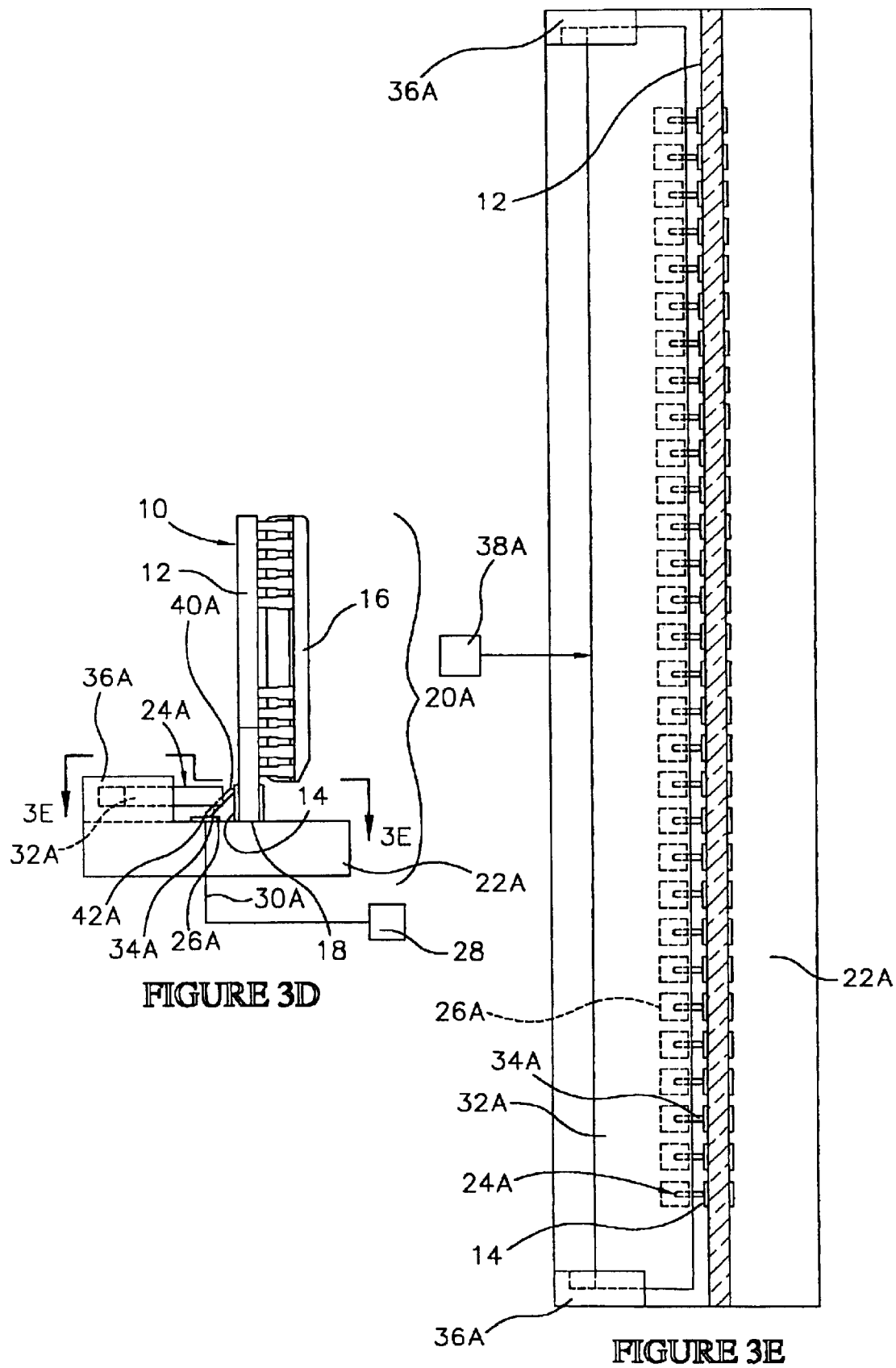

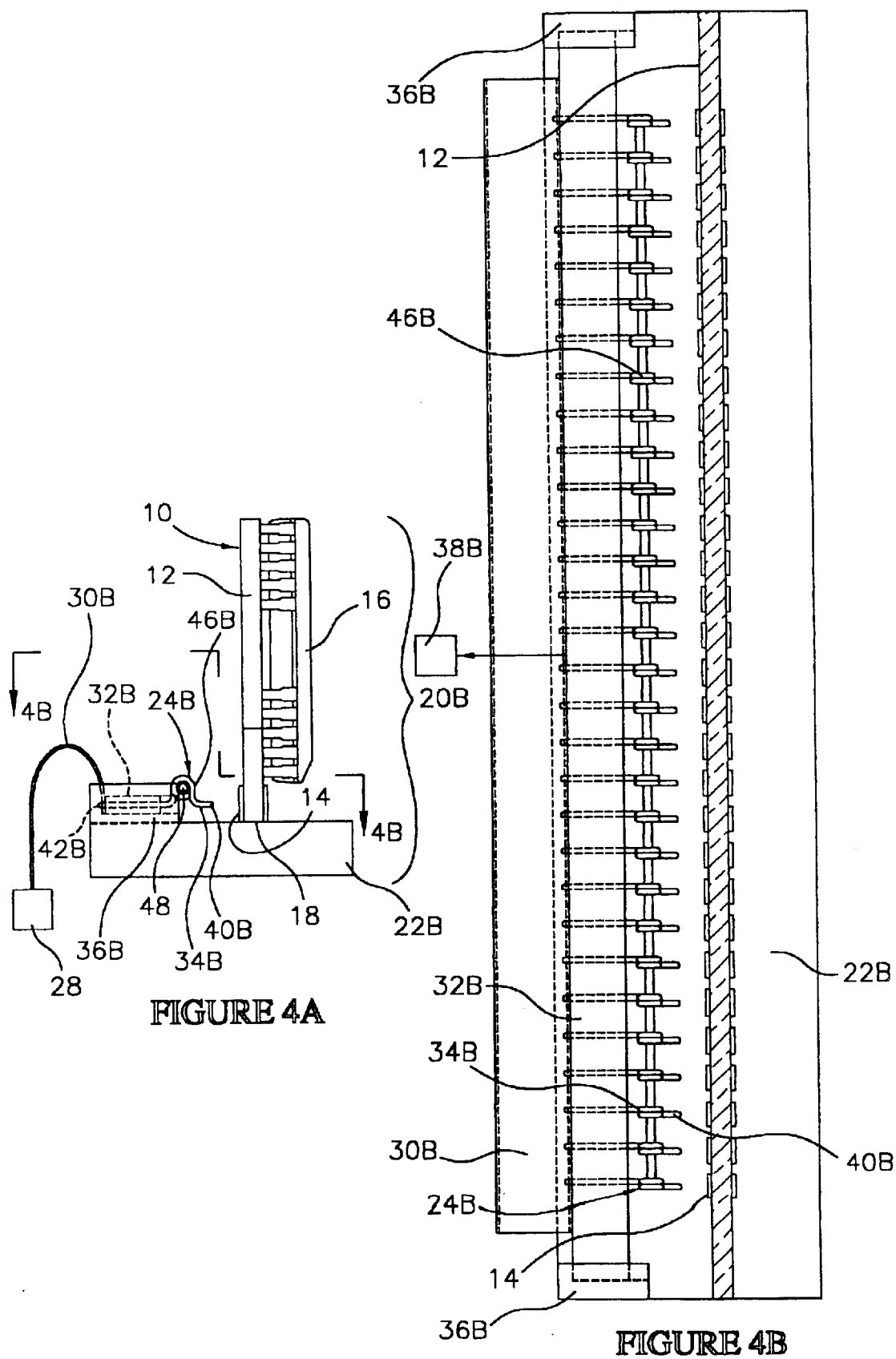

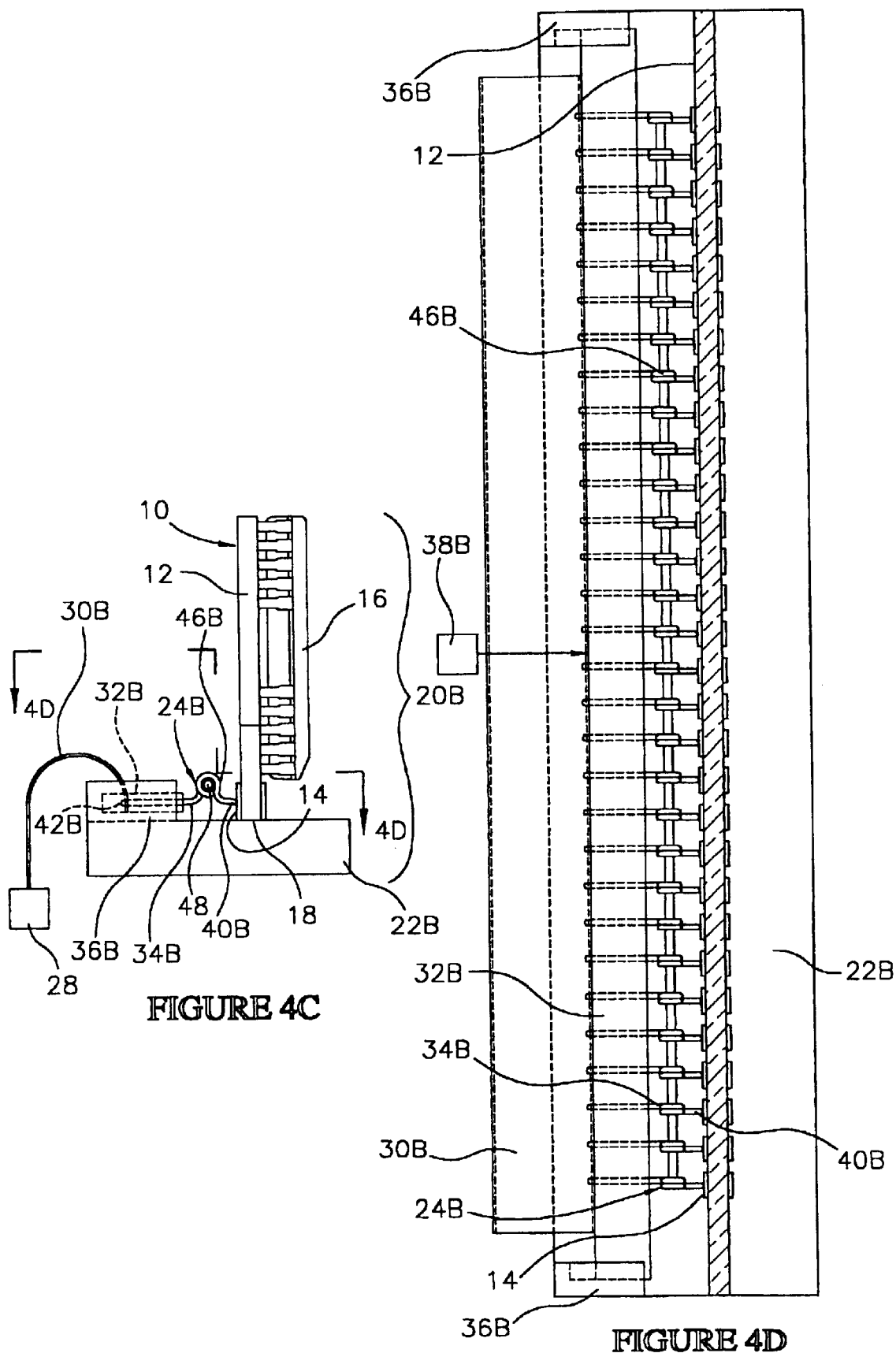

TEST SYSTEM AND TEST CONTACTOR FOR ELECTRONIC MODULES HAVING BEAM SPRING CONTACTS

CROSS REFERENCES TO RELATED APPLICATIONS

This application is a division of Ser. No. 09/650,161, filed on Aug. 28, 2000, now U.S. Pat. No. 6,483,329.

FIELD OF THE INVENTION

This invention relates generally to the testing of electronic modules, and more particularly to a test system, a test contactor and a test method for testing electronic modules.

BACKGROUND OF THE INVENTION

Electronic modules, such as semiconductor memory modules, multi chip modules, semiconductor carriers, semiconductor packages, and microprocessors are routinely tested during manufacture. The modules include terminal contacts in electrical communication with the electronic devices contained on the modules. For performing various test procedures on the modules, temporary electrical connections are made to the terminal contacts.

One type of prior art electronic module 10, which is illustrated in FIGS. 1A and 1B, includes a substrate 12, and multiple semiconductor packages 16 mounted to the substrate 12. The module 10 also includes a row of terminal contacts 14 on the substrate 12 in electrical communication with the integrated circuits contained on the semiconductor packages 16. The terminal contacts 14 comprise generally planar, in-line metal pads located on opposing sides of the substrate 12 along a lateral edge 18 thereof. The substrate 12 typically comprises an electrically insulating material such as a glass filled plastic (FR-4), or a ceramic. In addition, the substrate 12 includes through openings 19 which facilitate indexing and handling by automated test equipment and carriers.

For testing the electronic module 10 test systems have been developed and are commercially available from various manufacturers. These test systems are configured to make temporary electrical connections with the terminal contacts 14. In addition, the test systems are configured to apply test signals through the terminal contacts 14 to the electronic devices on the module 10, and then to analyze the response signals from the electronic devices. Often times these test systems merely test the gross functionality of the module 10, as the semiconductor packages 16 on the module 10 have been previously individually tested and burned-in.

The test systems typically include test boards and test circuitry in electrical communication with the test boards. In addition, the test boards typically include interface boards having test contactors configured to physically and electrically engage the terminal contacts 14 on either side of the module 10. In general there are two types of test systems, which are sometimes referred to as "pass through test systems", or "socket test systems".

FIG. 1C illustrates a pass through test system 11PT having an interface board 13PT, and test contactors 15PT on the interface board 13PT. The test contactors 15PT are in electrical communication with test circuitry (not shown). In addition, the test contactors 15PT are movable from an inactive (open) position in which the terminal contacts 14 on the module 10 are not engaged, to an active (closed) position in which the terminal contacts 14 on the module 10 are physically and electrically engaged.

As shown in Figure 1C, with the test contactors 15PT in an inactive (open) position, the module 10 can be indexed into a contactor area between the test contactors 15PT, as indicated by arrow 17PT. With the module 10 located in the contactor area, the test contactors 15PT can be mechanically moved to the active (closed) position to physically and electrically engage the terminal contacts 14. The pass through test contactors 15PT are sometimes referred to as being "zero insertion force" (ZIF) contactors because temporary electrical connections can be made without an insertion force being placed on the module 10.

FIG. 1D illustrates a socket test system 11S having an interface board 13S, and test contactors 15S on the interface board 13S. In this case, the test contactors 15S are normally in an active (closed) position, but are mechanically moved to an inactive (open) position as the module 10 is inserted from above as indicated by arrow 17S. When the module 10 is in place, the test contactors 15S move back to the active (closed) position to physically and electrically engage the terminal contacts 10. The socket test contactors 15S are sometimes referred to as being "low insertion force" (LIF) contactors because an insertion force is exerted on the module 10 in making the temporary electrical connections with the test contactors 15S.

One advantage of the pass through test system 11PT (FIG. 1C) over the socket test system 11S, is that no insertion forces are exerted on the module 10 to provide electrical engagement for testing. Accordingly, less physical stress is placed on the module 10 during testing with the pass through test system 11PT. Also, as the number of terminal contacts 14 on the module 10 increases, the insertion forces exerted by the socket test system 11S increase. The socket test system 11S can therefore damage the module 10, or the terminal contacts 14 on the module 10, and can be more expensive to operate and maintain.

The present invention is directed to an improved pass through test system. In pass through test systems it is desirable to make temporary electrical connections with the terminal contacts 14 on the modules 10 that are reliable, and have low electrical resistance. This requires that the terminal contacts 14 be scrubbed, or alternately penetrated by the test contactors 15PT, such that oxide layers and surface contaminants on the terminal contacts 14 do not adversely affect the temporary electrical connections. However, in scrubbing or penetrating the terminal contacts 14, damage to the terminal contacts 14 and modules 10 must be minimized.

It is also advantageous in pass through test systems for the temporary electrical connections to provide electrical paths that are short in length to facilitate the application of high speed test signals, and to prevent capacitive coupling and the introduction of noise and spurious signals. Further, it is advantageous to make, and then break, the temporary electrical connections as quickly as possible, to facilitate a high throughput for the test procedure.

The pass through test system of the invention includes test contactors configured to make temporary electrical connections that are reliable, have low electrical resistance, and minimally damage terminal contacts on the modules. In addition, the test contactors are relatively inexpensive to make, provide a high throughput, and can be operated in a production environment with minimal maintenance. Further, the test contactors are designed to electrically engage the terminal contacts with a zero insertion force on the module, and to exert a force for retaining the module on the interface board.

SUMMARY OF THE INVENTION

In accordance with the present invention, a pass through test system, a pass through test contactor, and a pass through test method for testing electronic modules are provided. In illustrative embodiments, the test system is configured for testing electronic modules having planar, in-line terminal contacts substantially as previously described.

The test system includes test circuitry configured to generate test signals, and an interface board having contact pads in electrical communication with the test circuitry. The interface board can be mounted to a test board of an automated or manual test handler configured to transport, align, and hold the module on edge on the interface board. The test system also includes test contactors on the interface board configured to physically and electrically engage the terminal contacts on the module, and to simultaneously physically and electrically engage the contact pads on the interface board.

In a first embodiment the test contactors include a base rotatably (pivotably) mounted to the interface board, and cantilevered spring contacts on the base configured to simultaneously scrub and penetrate the terminal contacts on the module, and also the contact pads on the interface board. The base and the spring contacts are rotatable from a first position (open) in which the terminal contacts are not engaged, to a second position (closed) in which the terminal contacts are physically and electrically engaged. Also, the base comprises molded plastic, and the spring contacts comprise resilient metal leaf springs embedded in the plastic. The spring contacts include leaf spring end portions for electrically engaging the terminal contacts on the modules, and leaf spring middle portions for electrically engaging the contact pads on the interface board.

In a second embodiment the test system includes an interface board and slidably mounted test contactors on the interface board. In this embodiment the test contactors include a base configured for sliding movement on the interface board, and short beam contacts on the base for simultaneously electrically engaging the terminal contacts on the module and the contact pads on the interface board. Also, the short beam contacts are oriented at an angle with respect to the surface of the contact pads and terminal contacts, such that forces are generated for making and maintaining the temporary electrical connections.

In a third embodiment the test system includes an interface board, and test contactors mounted on a base slidably mounted to the interface board. The base includes coiled spring contacts configured to generate spring forces for penetrating the terminal contacts. The test system also includes a flex circuit in electrical communication with the spring contacts and the test circuitry, configured to allow free sliding movement of the base on the interface board.

In each of the embodiments, the test contactors are designed to electrically engage the terminal contacts with a zero insertion force (ZIF) on the module. Movement of the test contactors into the terminal contacts can be provided by cams, hydraulic cylinders, motors or any suitable mechanical actuator. In addition, the test contactors are designed to penetrate, or to scrub, the terminal contacts during electrical engagement, and also to help retain the module on the interface board. Further, the test contactors are designed for quick engagement and disengagement with the terminal contacts, and are designed to provide a relatively short electrical path to the terminal contacts.

The test method includes the steps of: providing an interface board comprising a plurality of contact pads in electrical communication with test circuitry; providing a plurality of movable test contactors on the interface board comprising a plurality of spring contacts configured to electrically engage the terminal contacts and the contact pads with a zero insertion force; placing the module on the interface board with the terminal contacts proximate to and aligned with the test contactors; moving the test contactors to physically and electrically engage the terminal contacts and the contact pads with the spring contacts; and applying test signals through the test contactors and the terminal contacts to the module.

BRIEF DESCRIPTION OF THE DRAWINGS

FIG. 2A is a schematic side elevation view of a first embodiment test system constructed in accordance with the invention illustrating rotatable test contactors of the system prior to electrical engagement of terminal contacts on a module under test;

FIG. 2B is a schematic cross sectional view of the test system of FIG. 2A taken along line 2B—2B of FIG. 2A;

FIG. 2C is a schematic side elevation view of the test system of FIG. 2A illustrating the rotatable test contactors during electrical engagement of the terminal contacts on the module under test;

FIG. 2D is a schematic cross sectional view of the test system of FIG. 2A taken along line 2D—2D of FIG. 2C;

FIG. 3D is a schematic side elevation view of the test system of FIG. 3A illustrating the slidable test contactors during electrical engagement of the terminal contacts on the module under test;

FIG. 3E is a schematic cross sectional view of the test system of FIG. 3A taken along line 3E—3E of FIG. 3D;

FIG. 4A is a schematic side elevation view of a third embodiment test system constructed in accordance with the invention illustrating test contactors on a slidable base prior to electrical engagement of terminal contacts on a module under test;

FIG. 4B is a schematic side cross sectional view of the test system of FIG. 4A taken along line 4B—4B of FIG. 4A;

FIG. 4C is a schematic side elevation view of the test system of FIG. 4A illustrating the test contactors during electrical engagement of the terminal contacts on the module under test; and FIG. 4D is a schematic cross sectional view of the test system of FIG. 4A taken along line 4D—4D of FIG. 4C.

DETAILED DESCRIPTION OF THE PREFERRED EMBODIMENTS

Figure 1A:
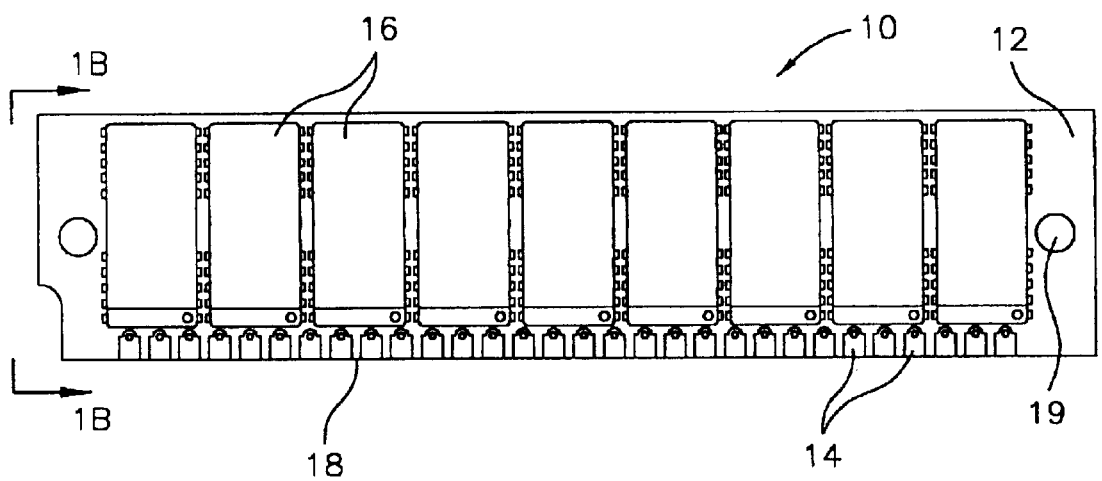
FIG. 1A is a plan view of a prior art electronic module.
Figure 1B:
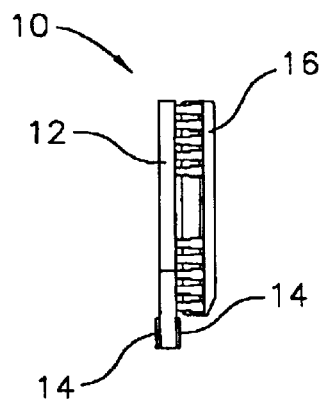
FIG. 1B is a side elevation view of FIG. 1A.
Figure 1C:
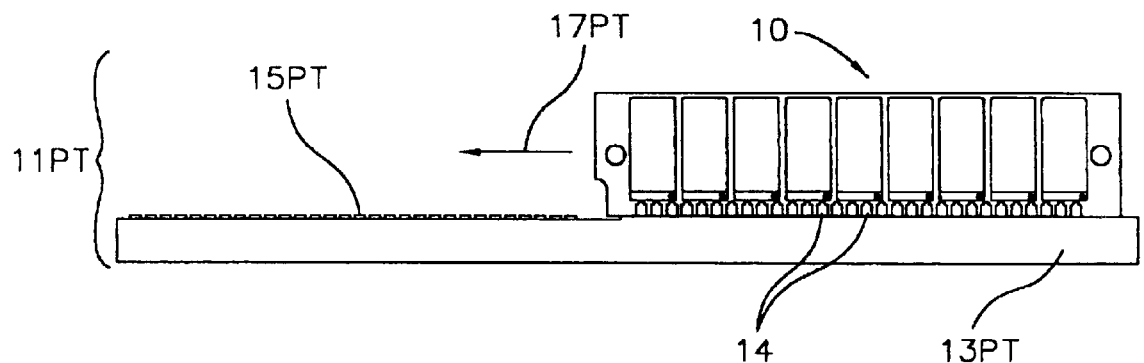
FIG. 1C is a schematic side elevation view of a prior art pass through test system.
Figure 1D:
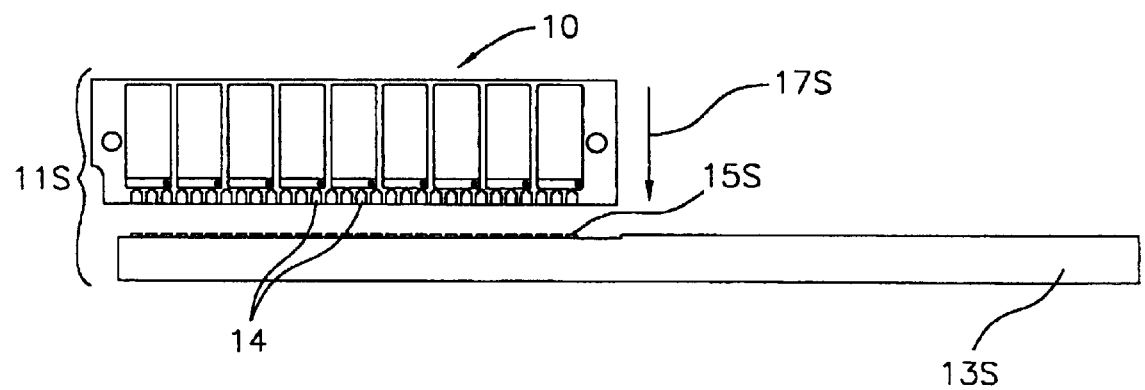
FIG. 1D is a schematic side elevation view of a prior art socket test system.

Referring to FIGS. 2A and 2B, a pass through test system 20 constructed in accordance with a first embodiment of the invention, and configured to test electronic modules 10, is illustrated. The test system 20 includes an interface board 22, and a plurality of test contactors 24 rotatably mounted to the interface board 22 configured to make temporary electrical connections with the terminal contacts 14 on the module 10.

As used herein, the term "pass through test system" means a test system in which temporary electrical connections are made with the terminal contacts 14 on the module 10 with a "zero insertion force". As used herein, the term "zero insertion force" means that no forces are being exerted on the module 10 to move the test contactors 24 in making the temporary electrical connections.

The interface board 22 is configured to support the module 10 on the edge 18 thereof substantially as shown. The interface board 22 is configured for mounting to an automated or manual pass through test handler (not shown). Support, movement and indexing of the module 10 can be provided by the test handler Suitable automated pass through test handlers are commercially available from Advantest Corporation, Tokyo, Japan, as well as other manufacturers.

The interface board 22 comprises an electrically insulating material, such as molded plastic, a glass filled resin (e.g., FR-4) or a ceramic. In addition, the interface board 22 includes a pattern of contact pads 26 in electrical communication with test circuitry 28. The test circuitry 28 is configured to generate and apply test signals to the integrated circuits contained on the module 10, and to analyze the resultant signals. Suitable test circuitry is commercially available from Advantest Corporation of Tokyo, Japan, Teradyne of Boston, Mass., as well as other manufacturers.

The contact pads 26 are formed in a pattern (size and spacing) that matches a pattern of the terminal contacts 14 on the module 10. The contact pads 26 can comprise a highly conductive metal, such as copper or aluminum. In addition, the interface board 22 can include conductors 30 such as conductive traces and metal filled vias that electrically connect the contact pads 26 to the test circuitry 28.

The test contactors 24 are configured to establish electrical communication between the terminal contacts 14 on the module 10, and the contact pads 26 on the interface board 22. The test contactors 24 include a rotatable (pivotable) base 32, and cantilevered spring contacts 34 on the base 32. Different constructions of the base 32 and the spring contacts 34 are possible. However, in the illustrative embodiment the base 32 comprises molded plastic, and the spring contacts 34 are molded integrally to the base 32. Suitable plastics for the base 32 include polyetherimide (PEI), polyethersulfone (PES), polyarylsulfone (PAS), polyphenylene sulfide (PPS), liquid crystal polymer (LCP), and polyether-ether ketone (PPEK). The spring contacts 34 preferably comprise a resilient metal, such as a copper alloy (e.g., beryllium copper), stainless steel, or a nickel-iron alloy.

The interface board 22 includes support members 36 on either end configured to support the base 32 for rotatable (pivotable) motion. The support members 36 can be molded integrally to the interface board 22, or can comprise separate members attached to the interface board 22. A drive mechanism 38 (FIG. 2B) is operably associated with the base 32, and is configured to rotate (pivot) the base 32, and the spring contacts 34, from the "open" (inactive) position of FIGS. 2A and 2B, to the "closed" (active) position of FIGS. 2C and 2D. The drive mechanism 38 can comprise a cam, a motor, a spring or other suitable actuator mechanism. In addition, the drive mechanism 38 can be a component of the test board or the test handler to which the interface board 22 is mounted.

Referring to FIGS. 2C and 2D, the spring contacts 34 include leaf spring tip portions 40 configured to physically and electrically engage the terminal contacts 14 on the module substrate 12 with a zero insertion force. In addition, the spring contacts 34 include leaf spring middle portions 42 configured to physically and electrically engage the contact pads 26 on the interface board 22. The leaf spring tip portions 40 and the leaf spring middle portions 42 are flat planar springs formed from a single piece of metal but oriented in opposite directions from an axis of the spring contacts 34. In the "closed" (active) position of the rotatable base 32, the spring contacts 34 establish electrical communication between the terminal contacts 14 on the module substrate 12, and the contact pads 26 on the interface board 22. This electrical communication provides a plurality of separate electrical paths between the test circuitry 28, and the integrated circuits contained on the semiconductor packages 16.

The construction of the spring contacts 34 provides several advantages for applying test signals to the module 10. One advantage is that the leaf spring tip portions 40 of the spring contacts 34 scrub the terminal contacts 14 on the module substrate 12 as the spring contacts 34 are rotated with the base 32 into the closed position. This scrubbing action scrubs and penetrates oxide layers on the terminal contacts 14, which provides low resistance temporary electrical connections. Another advantage is that the spring contacts 34 exert spring forces for maintaining the electrical connections, and also exert spring forces for holding the module 10 on the interface board 22.

Yet another advantage is that the electrical paths between the terminal contacts 14 and the contact pads 26 are relatively short, such that impedance, cross talk, and capacitive coupling are reduced. Still another advantage is that the temporary electrical connections can be made for testing, and then quickly disconnected following testing by the rotary motion of the spring contacts 34. The rotary motion thus provides a high throughput and a low dwell time for testing multiple modules 10 in a production environment. In addition, the spring contacts 34 are relatively robust and are able to withstand abuse in a production environment. Still further, the spring contacts 34 make the temporary electrical connections with the terminal contacts 14 without an insertion force being exerted on the module 10 (i.e., zero insertion force).

In the illustrative embodiment, the spring contacts 34 are configured to electrically engage the terminal contacts 14 on only one side of the module 10 along the edge 18 thereof. However, pairs of spring contacts 34 can also be configured to electrically engage the terminal contacts 14 on opposing sides of the module 10. For example, the spring contacts 34 can be configured to electrically engage every other terminal contact 14 on a first side of the module 10, while opposing spring contacts 34 can be configured to electrically engage every other terminal contact 14 on a second side of the module 10.

Also, the spring contacts 34 can be configured to electrically engage other types of terminal contacts than the flat planar terminal contacts 14 shown in the illustrative embodiments. For example, the spring contacts 34 can be configured to electrically engage bumped contacts (e.g., solder balls in a ball grid array), pin contacts (e.g., pins in a pin grid array), and various lead type contacts (e.g., stand off leads, j-bend leads).

Figure 3C:
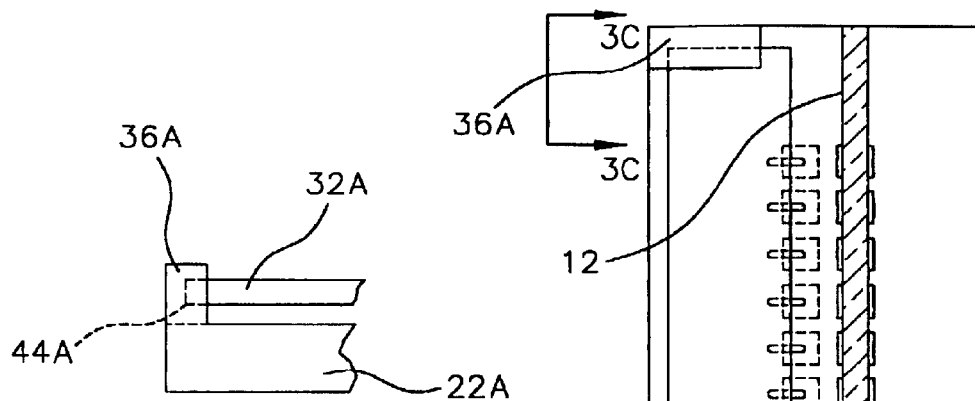
FIG. 3C is a schematic side elevation view taken along line 3C—3C of FIG. 3B illustrating a slidable base of the test contactors.
Figure 3A:
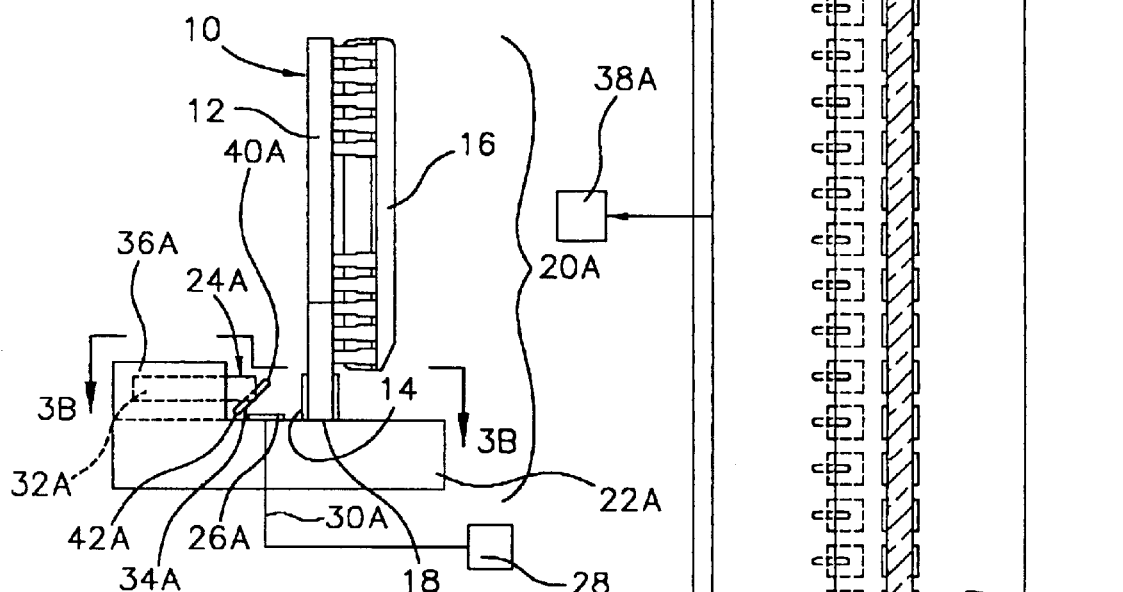
FIG. 3A is a schematic side elevation view of a second embodiment test system constructed in accordance with the invention illustrating slidable test contactors prior to electrical engagement of terminal contacts on a module under test.
Figure 3B:
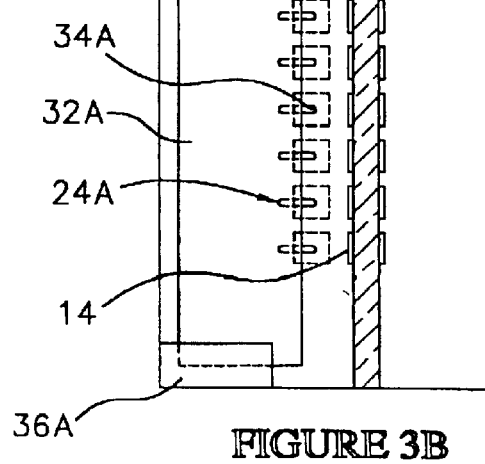
FIG. 3B is a schematic side cross sectional view of the test system of FIG. 3A taken along line 3B—3B of FIG. 3A.

Referring to FIGS. 3A and 3B, a pass through test system 20A constructed in accordance with a second embodiment of the invention is illustrated. The test system 20A includes an interface board 22A, and a plurality of test contactors 24A slidably mounted to the interface board 22A. The interface board 22A is configured to support the module 10 on the edge 18 thereof substantially as shown. In addition, the interface board 22A is configured for mounting to an automated or manual pass through test handler, substantially as previously described. Further, the interface board 22A includes contact pads 26A, and conductors 30A in electrical communication with the test circuitry 28 substantially as previously described.

The test contactors 24A are configured to establish electrical communication between the terminal contacts 14 on the module 10, and the contact pads 26A on the interface board 22A, with a zero insertion force on the module 10. The test contactors 24A include a slidable base 32A, and a plurality of short beam spring contacts 34A on the base 32A. Different constructions of the base 32A and the spring contacts 34A are possible. However, in the illustrative embodiment the base 32A comprises molded plastic, and the spring contacts 34A comprise metal beams molded integrally to the base 32A.

Further, the interface board 22A includes support members 36A on opposing ends thereof configured to support the base 32A for slidable motion over the planar surface of the interface board 22A. As shown in FIG. 3C, each support member 36A includes a slot 44A, and the base 32A slides within the slot 44A. The support members 36A can be molded integrally to the interface board 22A, or can comprise separate members attached to the interface board 22A. A drive mechanism 38A (FIG. 3B) is operably associated with the base 32A, and is configured to slide the base 32A and the spring contacts 34A from the "open" (inactive) position of FIGS. 3A and 3B, to the "closed" (active) position of FIGS. 3D and 3E.

The drive mechanism 38A can comprise a cam, a motor, a hydraulic cylinder, a spring or other suitable mechanical, hydraulic or electrical mechanism. In addition, the drive mechanism 38A can be a component of the test handler, to which the interface board 22A is mounted. The stroke or movement of the base 32A can be controlled by the design of the drive mechanism 38A. In addition, the drive mechanism 38A can be designed to "overdrive" the spring contacts 34A into the terminal contacts 14 by a selected amount.

Referring to FIGS. 3D and 3E, the short beam spring contacts 34A include spring tip portions 40A configured to physically and electrically engage the terminal contacts 14 on the module substrate 12. Rather than scrubbing the terminal contacts 14, as with the previous embodiment, the tip portions 40A are configured to penetrate the terminal contacts 14 to contact the underlying metal. In addition, the short beam spring contacts 34A include end portions 42A configured to physically and electrically engage the contact pads 26A on the interface board 22A. In the "closed" (active) position of the slidable base 32A, the short beam spring contacts 34A establish electrical communication between the terminal contacts 14 on the module substrate 12 and the contact pads 26A on the interface board 22A. This electrical communication provides electrical paths between the test circuitry 28, and the integrated circuits contained on the semiconductor packages 16.

As also illustrated in FIGS. 3D and 3E, the short beam spring contacts 34A are angled with respect to the planar surfaces of the terminal contacts 14 and the contact pads 26A. This configuration allows the short beam spring contacts 34A to exert spring forces on both the terminal contacts 14 and the contact pads 26A. These spring forces help to maintain the temporary electrical connections and to retain the module 10 on the interface board 22A. In the illustrative embodiment the angle of the short beam spring contacts 34A with respect to the terminal contacts 14 and the contact pads 26A is about 45'.

Referring to FIGS. 4A and 4B, a pass through test system 20B constructed in accordance with a third embodiment of the invention is illustrated. The test system 20B includes an interface board 22B, and a plurality of test contactors 24B slidably mounted to the interface board 22B. The interface board 22B is configured to support the module 10 on the edge 18 thereof substantially as shown. In addition, the interface board 22B is configured for mounting to an automated or manual pass through test handler, substantially as previously described.

The test contactors 24B are configured to establish electrical communication between the terminal contacts 14 on the module 10, and the test circuitry 28 with a zero insertion force being exerted on the module 10. The test contactors 24B include a slidable base 32B, and coiled spring contacts 34B on the base 32B. In this embodiment a flex circuit 30B is in electrical communication with the spring contacts 34B. The flex circuit 30B is designed to move with the slidable base 32B as the coiled spring contacts 34B engage and disengage the terminal contacts 14 on the module 10. As with the previous embodiments, the base 32B can comprise molded plastic, and the coiled spring contacts 34B can be molded integrally to the base 32B.

Also, the interface board 22B includes support members 36B on either opposing end thereof configured to support the base 32B for slidable motion. The support members 36B can be molded integrally to the interface board 22B, or can comprise separate members attached to the interface board 22B. A drive mechanism 38B (FIG. 4B) is operably associated with the base 32B, and is configured to slide the base 32B and the spring contacts 34B from the "open" (inactive) position of FIGS. 4A and 4B, to the "closed" (active) position of FIGS. 4C and 4D.

The drive mechanism 38B can comprise a cam, a motor, a spring or other suitable mechanism. In addition, the drive mechanism 38B can be a component of the pass through test handler, to which the interface board 22B is mounted. The stroke or movement of the base 32B can be controlled by the design of the drive mechanism 38B. In addition, the drive mechanism 38B can be designed to "overdrive" the spring contacts 34B into the terminal contacts 14 by a selected amount.

Referring to FIGS. 4C and 4D, the spring contacts 34B include spring tip portions 40B configured to physically and electrically engage the terminal contacts 14 on the module substrate 12. Rather than scrubbing the terminal contacts 14, as with the previous embodiment, the tip portions 40B are configured to penetrate the terminal contacts 14 to contact the underlying metal. In this embodiment the tip portions 40B are attached to spring coils 46B, that enhance the spring force exerted by the tip portions 40B during electrical engagement of the terminal contacts 14. In particular, as shown in FIGS. 4C and 4D the spring coils 46B function to exert torsional spring forces on the tip portions 40B for penetrating the terminal contacts 14. The spring contacts 34B also include end portions 42B in electrical communication with the flex circuit 30B. In addition, the spring contacts 34B include a single support pin 48 which is located in the open center portions of the spring coils 46B, and is configured to provide support and retention for the spring contacts 34B.

In the "closed" (active) position of the slidable base 32B, the spring contacts 34B establish electrical communication between the terminal contacts 14 on the module substrate 12 and the flex circuit 30B. This electrical communication provides electrical paths between the test circuitry 28, and the integrated circuits contained on the semiconductor packages 16.

Thus the invention provides a pass through test system, a pass through test contactor, and a pass through test method for electronic modules. Although the invention has been described with reference to certain preferred embodiments, as will be apparent to those skilled in the art, certain changes and modifications can be made without departing from the scope of the invention, as defined by the following claims.

I claim:

1. A system for testing an electronic module having a plurality of terminal contacts comprising:

a test circuitry configured to generate and apply test signals to the module;

a board comprising a plurality of contacts in electrical communication with the test circuitry; and a plurality of beam contacts on the board movable from a first position in which the terminal contacts can be aligned with the beam contacts with a zero insertion force on the module, to a second position in which the beam contacts simultaneously electrically engage the terminal contacts and the contacts, each beam contact comprising a first portion configured in the second position to electrically engage a contact on the board, and a second portion configured in the second position to electrically engage a terminal contact on the module.

2. The system of claim 1 wherein the second portion is configured to penetrate the terminal contact.

3. The system of claim 1 wherein the first portion comprises a first end of the beam contact and the second portion comprises a second end of the beam contact.

4. The system of claim 1 wherein the board comprises at least one support and the beam contacts comprise a base slidably mounted to the at least one supports.

5. The system of claim 1 wherein the contacts comprise planar pads.

6. The system of claim 1 wherein the module comprises an element selected from the group consisting of semiconductor memory modules, multi chip modules, semiconductor carriers, semiconductor packages, and microprocessors.

7. A system for testing an electronic module having a plurality of terminal contacts comprising:

a test circuitry configured to generate and apply test signals to the module;

a board comprising a plurality of contact pads in electrical communication with the test circuitry;

a plurality of contacts on the board movable from a first position in which the terminal contacts can be aligned with the contacts with a zero insertion force on the module to a second position in which the contacts simultaneously electrically engage the contact pads and the terminal contacts, each contact comprising a first spring tip portion configured to electrically engage a contact pad on the board in the second position, and a second spring tip portion configured to penetrate a terminal contact on the module in the second position.

8. The system of claim 7 the contacts comprise angled beams.

9. In a test system including a test circuitry for applying test signals to an electronic module having a plurality of terminal contacts and a board having a plurality of contact pads in electrical communication with the test circuitry, a test contactor for establishing electrical communication between the test circuitry and the module comprising:

a plurality of beam spring contacts on the board movable from a first position in which the terminal contacts can be aligned with the beam spring contacts with a zero insertion force on the module, to a second position in which the beam spring contacts simultaneously electrically engage the terminal contacts and the contact pads, each beam spring contact comprising a first spring tip portion configured in the first position to be spaced from a contact pad and in the second position to electrically engage the contact pad, and a second spring tip portion configured in the first position to align with a terminal contact and in the second position to penetrate the terminal contact.

10. The test contactor of claim 9 further comprising a base for the beam spring contacts slidably mounted to the board.

11. The test contactor of claim 9 further comprising a test handler configured to move the beam spring contacts from the first position to the second position.

* * * * *

UNITED STATES PATENT AND TRADEMARK OFFICE
CERTIFICATE OF CORRECTION

PATENT NO. : 6,727,715 B2 Page 1 of 1
DATED : April 27, 2004
INVENTOR(S) : Daniel P. Cram It is certified that error appears in the above-identified patent and that said Letters Patent is hereby corrected as shown below:

Column 9,
Line 40, change "supports" to -- support --.

Signed and Sealed this

Twenty-second Day of February, 2005

JON W. DUDAS
*Director of the United States Patent and Trademark Office*